Oct. 31, 1961 W. J. WILSON ET AL 3,006,819

METHOD OF PHOTO-PLATING ELECTRICAL CIRCUITS

Filed June 13, 1955

William J. Wilson
Harry Takesian
*INVENTORS*

BY Richard P. Schulze

Attorney

United States Patent Office 3,006,819
Patented Oct. 31, 1961

3,006,819

METHOD OF PHOTO-PLATING ELECTRICAL CIRCUITS

William J. Wilson, Nashua, N.H., and Harry Takesian, Groveland, Mass., assignors, by mesne assignments, to Sanders Associates, Inc., Nashua, N.H., a corporation of Delaware Filed June 13, 1955, Ser. No. 515,110
1 Claim. (Cl. 204—15)

The present invention relates to printed circuits. More particularly, the invention relates to a process for manufacturing printed circuits involving photography, chemical reduction, and electro-deposition.

In the prior art a number of procedures have been advanced for manufacturing printed circuits. These prior art processes are inherently limited in application in that they are characterized by a lack of definition in design reproduction and complexity of technique.

It is therefore an object of the invention to provide an improved method of printing electrical circuits in a desired circuit configuration on an insulating panel.

A further object of the invention is to provide an improved method of manufacturing printed circuits involving a catalytic reduction process.

A still further object of the invention is to provide an improved method of manufacturing printed circuits utilizing photographic, catalytic chemical reduction and electro-deposition processes.

It is a still further object of the invention to provide an improved printed circuit as an article of manufacture in which the conductors are affixed to an adherent base metal in a desired circuit configuration.

Other and further objects of the invention will be apparent from the following description of typical methods of practicing the invention and a typical embodiment thereof, taken in connection with the accompanying drawing.

In accordance with the present invention there is provided a method of manufacturing printed circuits on an insulating panel. A surface of the insulating panel is sensitized with a coating of a catalytic agent which is a metallic salt having low electrical conductivity. The catalytic agent is in turn coated with a layer of photosensitive resist material. The photosensitive resist material is exposed to light through a positive transparency wherein the desired circuit configuration is opaque. The exposed resist material is then dissolved to expose the surface of the metallic salt. In response to the catalytic agent, metal is chemically deposited on the exposed surface of the metallic salt in the circuit configuration.

In the preferred method of practicing the invention a circuit of an insulating panel is sensitized by immersing the panel in an aqueous soltuion of stannous chloride or Rochelle salt solution. The surface is coated with a catalytic agent consisting essentially of a metallic chloride salt selected from the group of metals consisting of iron, platinum, silver, nickel, gold, palladium, rhodium, aluminum and copper. The surface is then coated with a layer of photosensitive resist material. The resist material is exposed preferably to ultra-violet light through a positive transparency wherein the desired circuit configuration is opaque and baked under infra-red light.

The unexposed resist material is then dissolved in a suitable solvent such as benzol or benzene, leaving behind resist material in the negative of the configuration of the desired circuit.

The panel is immersed in an aqueous solution of a nickel or cobalt salt and sodium hypophosphite. Where a nickel salt is utilized, the amount of nickel ion present is less than or substantially equal to 3% by weight of the solution and the amount of hypophosphite radical ion is substantially less than or equal to 3% by weight of the solution. Where a cobalt salt is utilized the amount of cobalt ion is substantially less than or equal to 2.5% by weight of the solution and the amount of hypophosphite radical ion is substantially less than 10.7% of the solution. By means of a catalytic chemical reduction reaction, nickel or cobalt is plated onto the panel in the desired configuration. The panel is then immersed in an electroplating bath to plate more highly conductive metals on the nickel or cobalt. The conductive metals utilized for this purpose are selected from the group including gold, platinum, copper, aluminum and rhodium.

In a modification of the method of the invention, a gelatinous film is photographically treated to provide a negative transparency having the desired printed circuit configuration. The film is coated with a catalytic sensitizing agent consisting essentially of a metallic chloride salt selected from the group of metals consisting of iron, platinum, silver, nickel, gold, palladium, rhodium, aluminum and copper.

The film is then immersed in an aqueous solution of a nickel or cobalt salt as described above to plate nickel or cobalt on sensitized areas of the film in the desired printed circuit configuration. The nickel or cobalt is then coated by electro-deposition with a conductive metal consisting essentially of a metal selected from the group including copper, silver, platinum, rhodium or aluminum, to provide a printed circuit panel.

In accordance with the preferred embodiment of the invention there is provided, as an article of manufacture, a printed circuit panel. The panel comprises an insulating panel to which is affixed a base metal of nickel or cobalt in a desired electrical circuit configuration. An adherent medium such as a metallic chloride salt selected from the group of metals consisting of iron, platinum, silver, nickel, palladium, rhodium, cobalt, gold, aluminum and copper is utilized to secure the nickel or cobalt to the insulating panel. The nickel is coated with a layer of more highly conductive metal such as gold, silver, platinum, copper, or rhodium.

Figure 1:
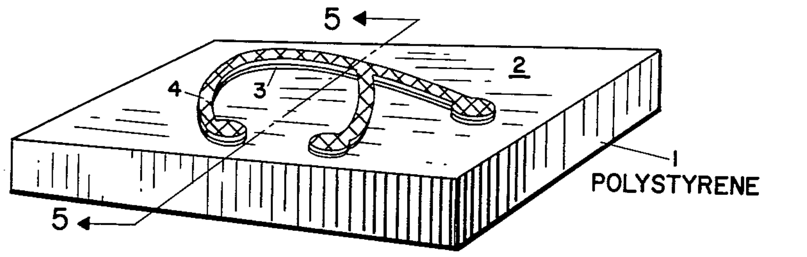
FIG. 1 is a perspective view of a printed circuit panel embodying the present invention.

Referring now to the drawings and with particular reference to FIG. 1, an insulating panel 1 composed, for example, of polystyrene 4 inches long, 3 inches wide and 1/16 of an inch thick, carries a printed circuit generally indicated at 2 of which the conductors are shown hatched. The conductors comprise a layer of base metal 3 of nickel or cobalt covered with a plating 4 of a relatively more highly conductive metal such as platinum, gold, silver, copper, or rhodium.

Figure 2:
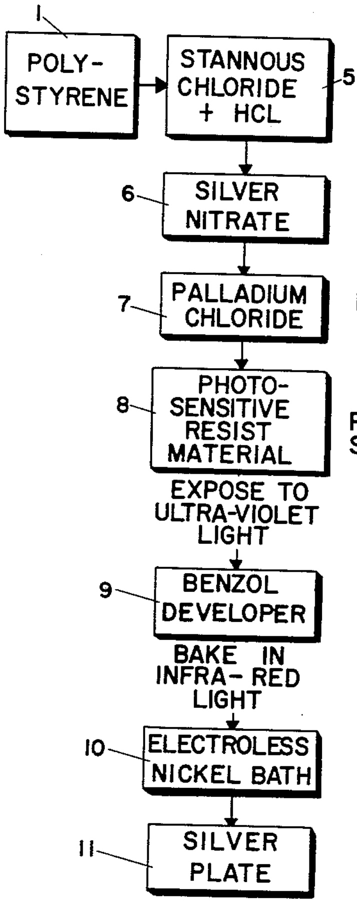
FIG. 2 is a flow chart illustrating a preferred process of the present invention.

In FIG. 2, a flow chart is presented outlining the process for manufacturing the printed circuit of FIG. 1. An insulating panel composed, for example, of polystyrene is thoroughly cleaned either mechanically or chemically by such well known processes as vapor degreasing, solvent wiping, vapor blasting, sand blasting, and so forth. The insulating panel is further cleaned in a mild alkaline cleaner followed by a cold running water rinse. An electrolyzing current may be utilized in combination with the alkaline cleaner. The panel is then dipped into a 10% aqueous solution of sulphuric acid, rinsed in cold running water and then in distilled water.

The panel is then processed as follows:

*Step 1.*—While still wet the panel is immersed for 3–5 minutes in a 10–12% aqueous solution of a stannous chloride 5 to which 10–15 cubic centimeters of hydrochloric acid is added per gallon of solution.

*Step 2.*—The panel is rinsed in distilled water and then immersed in a 3–5% aqueous solution of silver nitrate 6 for approximately 3 minutes or until a noticeably brown tinge develops and is then rinsed in distilled water.

*Step 3.*—The panel is immersed in an aqueous solution of 1 gram per liter of palladium chloride 7 for 1–3 minutes and then rinsed in distilled water and dried.

*Step 4.*—The dry panel is covered with a photosensitive resist material 8, such as Eastman Kodak Photo Resist. The panel is then centrifuged at a temperature of 120° to 140° F. until such time as the resist material becomes relatively hard, for example 2–3 minutes.

Figure 3:
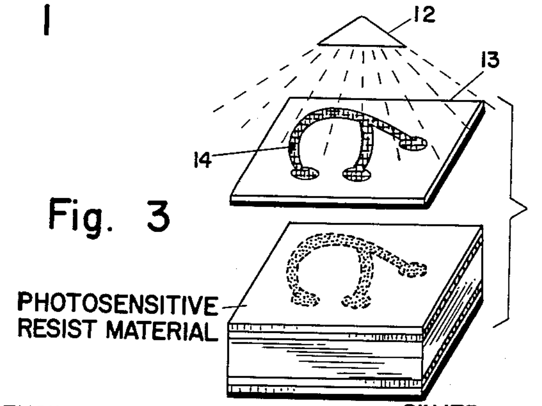
FIG. 3 is an isometric view of the embodiment of FIG. 1 as it appears during an early phase of the process of FIG. 2.

*Step 5.*—As shown in FIG. 3, the sensitized panel is exposed to an ultra-violet lamp 12 for approximately 4 minutes through a positive transparency 13 in which the shaded areas have the desired circuit configuration 14 and are relatively opaque; the unshaded areas of the transparency 13 are relatively transparent.

*Step 6.*—The panel is immersed in a benzene of benzol organic solvent bath 9 for 2–3 minutes to remove the unexposed portions of the resist material 8 and is then rinsed in distilled water.

*Step 7.*—The ultra-violet light exposed surface of the panel is then irradiated under an infra-red lamp for 2–3 minutes to completely harden the resist.

*Step 8.*—The panel is then immersed in an electroless nickel plating bath 10 for ½–10 minutes a temperature of 190° to 200° F. The bath comprises an aqueous solution of nickel chloride, sodium nitrate, sodium hypophosphite, and distilled water. Electroless nickel and cobalt plating are disclosed in U.S. Patents Nos. 2,532,283 and 2,532,284 issued to Brenner et al. on December 5, 1950. A coating of nickel approximately .0001 of an inch thick is plated on the panel. The panel is then rinsed in distilled water.

*Step 9.*—A more highly conductive coating of silver 11, or such metals as aluminum, platinum, rhodium, gold, or copper, is then electro-plated on the nickel base metal in accordance with well known procedures of the prior art.

Figures 4, 5:
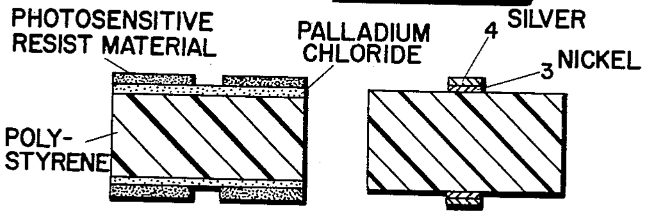
FIG. 4 is a sectional view of the embodiment in FIG. 1 as it appears during an intermediate phase of the process of FIG. 2.
FIG. 5 is a sectional view of the embodiment in FIG. 1 taken along the lines 5—5.

In FIG. 5 a cross-section of the completed printed circuit taken along the lines 5—5 in FIG. 1 is illustrated. The circuit as shown is conductor-clad on two surfaces. Depending upon the solvents that are utilized, a coating of palladium chloride and the photosensitive resist material may be left on the insulating panel without harm. Here the resist material and palladium chloride are dissolved by immersing in a solution of any ketone solvent.

Figure 6:
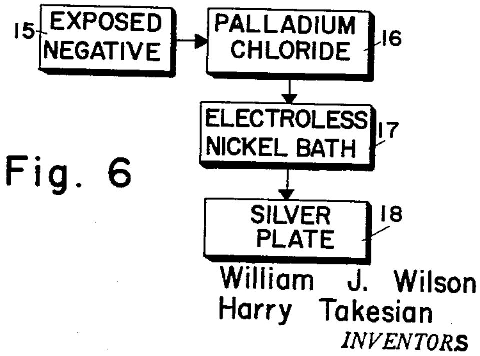
FIG. 6 is a flow chart of a modification of the preferred process of the invention.

As shown in the flow chart of FIG. 6, a printed circuit may be manufactured from a photographically processed, exposed gelatinous, negative 15 which is sensitized; for example, with palladium chloride 16. The negative is rinsed, immersed in an electroless nickel bath 17 and then covered with silver plate 18 by electro-deposition.

Polystyrene base material is available for photographic negatives and can readily be used where its dielectric characteristics are required. In utilizing the negative as an insulating panel for the printed circuit, accurate alignment is readily obtained where registration of conductors on both sides of the negative is desired.

Similarly, an insulating panel, such as XXXP-phenolic resin laminate, may be sensitized with a photographic silver-containing emulsion and used as a photographic plate to photograph the desired circuit configuration. The baseplate may then be processed as outlined in FIG. 6 after photographic development.

In a further modification of the process of the invention, the copper clad insulating panel formed, for example, of XXXP-phenolic laminate may be photosensitized and exposed to positive transparency wherein the desired circuit configuration is opaque. The ordinary process of photographic development removes the photographic emulsion where it is not sensitized by light; the remaining emulsion may be utilized as a resist to an etching bath.

The conductor definition and reproducibility obtainable with the present invention is beyond that possible in the prior art. In photoetching, for example, conductors must be at least .010 of an inch wide where copper .001 of an inch thick is used to prevent under-cutting of the conductors. Using the principles of this invention, conductors .001 of an inch wide and less may be formed.

While there has been hereinbefore presented what are at present preferred modes of practicing the present invention and a preferred embodiment, it will be apparent that many and various changes and modifications of the preferred modes and embodiment may be effected without departing from the spirit and scope of the invention. It will be understood, therefore, that all such changes and modifications as fall fairly within the scope of the present invention, as defined in the appended claim, are to be considered as a part of the present invention.

What is claimed is:

The method of printing electrical circuits in a desired configuration on an insulating panel which comprises: forming a photographic silver image on the surface of said insulating panel of the intended conductive path of said circuit; coating said photographic image with a catalytic agent consisting essentially of a chloride salt of palladium; then immersing said insulating panel in an aqueous solution containing a metallic salt selected from a group of metals consisting of nickel and cobalt and a reducing agent which will cause a film to be deposited of the metal of said salt on said image by chemical reduction; and plating said metal film with a more highly conductive metal to provide said printed electrical circuit.

References Cited in the file of this patent

UNITED STATES PATENTS

| | | |
|---|---|---|
| 1,963,834 | Decker | June 19, 1934 |
| 2,214,646 | Walker | Sept. 16, 1940 |
| 2,279,567 | Holman | Apr. 14, 1942 |
| 2,399,799 | Guellich | May 7, 1946 |
| 2,441,960 | Eisler | May 25, 1948 |
| 2,443,119 | Rubin | June 8, 1948 |
| 2,532,283 | Brenner | Dec. 5, 1950 |
| 2,532,284 | Brenner | Dec. 5, 1950 |
| 2,581,472 | Dudley et al. | Jan. 8, 1952 |
| 2,699,425 | Nieter | Jan. 11, 1955 |
| 2,702,253 | Bergstrom | Feb. 15, 1955 |
| 2,728,693 | Cado | Dec. 27, 1955 |
| 2,729,696 | Mapelsden et al. | Jan. 3, 1956 |
| 2,758,074 | Black et al. | Aug. 7, 1956 |
| 2,783,193 | Nieter | Feb. 26, 1957 |

OTHER REFERENCES

Eisler: "Printed Circuits and Their Future Prospects," (the figure on page 2 relied on).